US012452988B2

(12) United States Patent
Yang et al.

(10) Patent No.: US 12,452,988 B2
(45) Date of Patent: Oct. 21, 2025

(54) MULTIPLE PLASMA ION SOURCE FOR INLINE SECONDARY ION MASS SPECTROMETRY

(71) Applicant: Applied Materials, Inc., Santa Clara, CA (US)

(72) Inventors: Ming Hong Yang, Campbell, CA (US); Dimitry Kouzminov, Beverly, MA (US); Arun Ramaswamy Srivatsa, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 501 days.

(21) Appl. No.: 17/941,473

(22) Filed: Sep. 9, 2022

(65) Prior Publication Data

US 2024/0090111 A1 Mar. 14, 2024

(51) Int. Cl.

| | |
|---|---|
| ***H05H 1/00*** | (2006.01) |
| ***H01J 37/32*** | (2006.01) |
| ***H01J 37/34*** | (2006.01) |
| *G01N 23/2258* | (2018.01) |

(52) U.S. Cl.

CPC ....... *H05H 1/0037* (2013.01); *H01J 37/3244* (2013.01); *H01J 37/3402* (2013.01); *G01N 23/2258* (2013.01)

(58) Field of Classification Search

CPC .............. H01J 49/10; H01J 1437/3244; G01N 23/2258; H05H 1/0037

See application file for complete search history.

(56) References Cited

U.S. PATENT DOCUMENTS

| | | | | |
|---|---|---|---|---|
| 8,779,400 B2 | 7/2014 | Shichi et al. | | |
| 2013/0140450 A1* | 6/2013 | Graupera | H01J 37/05 250/281 |
| 2016/0276128 A1 | 9/2016 | Ikeda et al. | |
| 2017/0025252 A1 | 1/2017 | Liang et al. | |

(Continued)

FOREIGN PATENT DOCUMENTS

| | | |
|---|---|---|
| JP | 2008-209312 A | 9/2008 |
| KR | 10-1323721 B1 | 10/2013 |
| WO | WO 2008-152132 A2 | 12/2008 |

OTHER PUBLICATIONS

International Search Report for PCT US 2023/032144, dated Dec. 26, 2023.

*Primary Examiner* — David E Smith

(74) *Attorney, Agent, or Firm* — Moser Taboada

(57) ABSTRACT

Methods leverage premixed gas mixtures to perform a metrology process on a substrate using an inline secondary ion mass spectrometry (SIMS) process. The premixed gas mixture of two or more gases is injected into a plasma chamber that is configured to produce sputtering ions for the inline SIMS process. The two or more gases produce non-metallic ion species which are compatible with downstream substrate fabrication processes and allow further fabrication to be performed on the substrate after the inline SIMS process has completed. The sputtering ions are ejected from the plasma chamber into a magnetic field. The intensity of the magnetic field is altered to select a single species of ions. The single species of ions are directed towards a surface of the substrate and secondary ions sputtered from the surface of the substrate by the selected species of ions are detected and analyzed.

20 Claims, 2 Drawing Sheets

(56) References Cited

U.S. PATENT DOCUMENTS

| | | | | |
|---|---|---|---|---|
| 2017/0025264 | A1* | 1/2017 | Sedlacek ............ | G01N 23/2258 |
| 2017/0271161 | A1* | 9/2017 | Kawasaki ........... | H01J 37/3171 |
| 2018/0269046 | A1 | 9/2018 | Moellers et al. | |

* cited by examiner

MULTIPLE PLASMA ION SOURCE FOR INLINE SECONDARY ION MASS SPECTROMETRY

FIELD

Embodiments of the present principles generally relate to semiconductor processing of semiconductor substrates.

BACKGROUND

Secondary ion mass spectrometry (SIMS) is a metrology technique that uses a primary ion or incident ion to strike a surface of a material under test. As the incident ion strikes the material, a secondary ion is expelled from the surface and captured by a secondary ion detector. The SIMS process allows for determination of deposited film parameters in semiconductor manufacturing such as dopant levels and film impurities. The inventors have observed, however, that because the testing may cause damaging particle contamination, the SIMS process is performed outside of the manufacturing flow, and the tested wafer or substrate is discarded after the test is performed.

Accordingly, the inventors have provided methods and apparatus for performing SIMS processing inline with the manufacturing flow using a multiple ion source, improving yields and minimizing SIMS apparatus down time.

SUMMARY

Methods and apparatus for performing inline SIMS processing with a multiple ion source are provided herein.

In some embodiments, a method for performing a metrology process on a substrate using an inline secondary ion mass spectrometry (SIMS) process may comprise injecting a premixed gas mixture of two or more gases into a plasma chamber configured to produce sputtering ions for the inline SIMS process which is compatible with downstream substrate fabrication processes, wherein the two or more gases produce non-metallic ion species, ejecting sputtering ions from the plasma chamber into a magnetic field, altering an intensity of the magnetic field to select a single species of ions formed from only one of the two or more gases of the premixed gas mixture, directing the single species of ions towards a surface of the substrate, and detecting secondary ions sputtered from the surface of the substrate by the single species of ions.

In some embodiments, the method may further include wherein the premixed gas mixture contains, at least, an oxygen gas and at least one inert gas, wherein the at least one inert gas is argon gas, helium gas, or xenon gas, wherein a selection of the premixed gas mixture or a selection of the single species of ions is accomplished automatically, automatically selecting gases or gas ratios for the premixed gas mixture based on a recipe executed by a controller of the inline SIMS process, automatically selecting the single species of ions based on a recipe executed by a controller of the inline SIMS process, dynamically switching the single species of ions from a first selection of ion species to a second selection of ion species different from the first selection of ion species solely by altering the magnetic field, wherein the premixed gas mixture contains two gases with a gas ratio of 50:50 or 80:20, wherein the premixed gas mixture is mixed in a gas manifold prior to injecting the premixed gas mixture into the plasma chamber, wherein the inline SIMS process is adjusted based on a gas ratio of the premixed gas mixture, mass of ions, or intensity of sputtering ions, and/or wherein a gas ratio of the premixed gas mixture is selected based on providing a stabilized plasma in the plasma chamber.

In some embodiments, a non-transitory, computer readable medium having instructions stored thereon that, when executed, cause a method for performing a metrology process on a substrate using an inline secondary ion mass spectrometry (SIMS) process to be performed, the method may comprise injecting a premixed gas mixture of two or more gases into a plasma chamber configured to produce sputtering ions for the inline SIMS process which are compatible with downstream substrate fabrication processes, wherein the two or more gases produce non-metallic ion species, ejecting sputtering ions from the plasma chamber into a magnetic field, altering an intensity of the magnetic field to select a single species of ions formed from only one of the two or more gases of the premixed gas mixture, directing the single species of ions towards a surface of the substrate, and detecting secondary ions sputtered from the surface of the substrate by the single species of ions.

In some embodiments, the method of the non-transitory, computer readable medium may further include wherein the premixed gas mixture contains, at least, an oxygen gas and at least one inert gas, wherein a selection of the premixed gas mixture or a selection of the single species of ions is accomplished automatically, automatically selecting gases or gas ratios for the premixed gas mixture based on a recipe executed by a controller of the inline SIMS process or automatically selecting the single species of ions based on a recipe executed by a controller of the inline SIMS process, dynamically switching the single species of ions from a first selection of ion species to a second selection of ion species different from the first selection of ion species solely by altering the magnetic field, wherein the premixed gas mixture is mixed in a gas manifold prior to injecting the premixed gas mixture into the plasma chamber, wherein the inline SIMS process is adjusted based on a gas ratio of the premixed gas mixture, mass of ions, or intensity of sputtering ions, and/or wherein a gas ratio of the premixed gas mixture is selected based on providing a stabilized plasma in the plasma chamber.

In some embodiments, an apparatus for performing an inline secondary ion mass spectrometry (SIMS) process may comprise a premixed gas mixture source that contains a premixed gas mixture of two or more gases, wherein the two or more gases contain non-metallic ion species which are compatible with downstream substrate fabrication processes, a plasma chamber fluidly connected to the premixed gas mixture source and configured to produce two or more ion species from the two or more gases from the premixed gas mixture source, a primary mass filter that is fluidly connected to the plasma chamber and configured to select a sputtering ion species from the two or more ion species by adjusting a magnetic field, and a controller configured to automatically inject the premixed gas mixture from the premixed gas mixture source into the plasma chamber, eject ions formed from the two or more gases from the plasma chamber into the magnetic field of the primary mass filter, and alter an intensity of the magnetic field to select a single species of ions formed from only one of the two or more gases of the premixed gas mixture.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
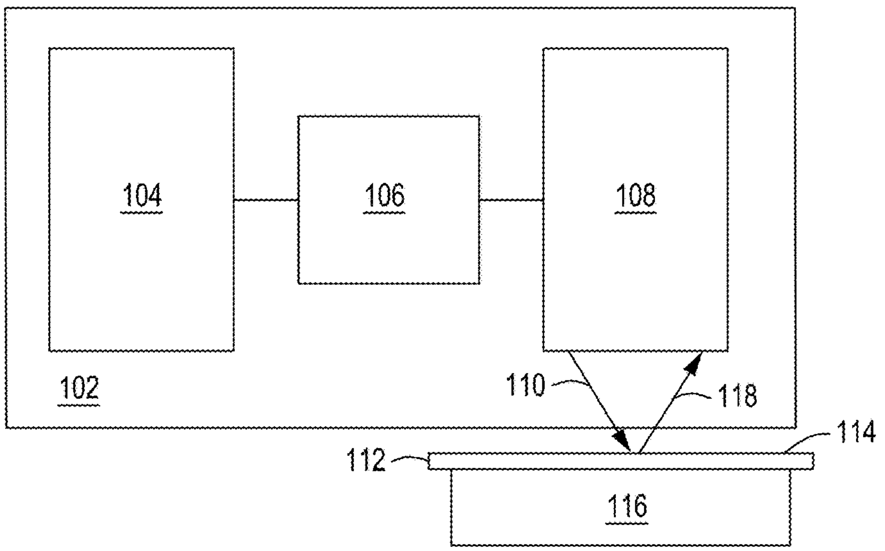
FIG. 1 depicts a cross-sectional view of an inline SIMS apparatus in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a nondestructive, inline SIMS (a standalone tool/process that is cleanroom compatible and can be used as part of the semiconductor fabrication process) using a multiple ion source. In some embodiments, two or more ion species are produced using a mixed gas plasma ion source for inline metrology applications. Various gas mix ratios can be utilized for source stability and spatial resolution for SIMS applications. In some embodiments, the gas mix may include $O_2^+$ ions and inert gas ions, such as, but not limited to, $O_2$:Ne, $O_2$:Ar, $O_2$:Kr, and/or $O_2$:Xe. By introducing inert gases into the ion source for inline SIMS applications, the present principles have the benefit of being able to switch ion beam species types without the need to switch gases. By removing the requirement to switch gases, productivity is increased, metrology data quality is improved, and maintenance costs are reduced. The present principles allow different ion beam species measurements inline on a single wafer without prolonged delay due to the time required to switch gases and tool conditioning prior to metrology testing with a different ion species.

SIMS is a powerful metrology technique that is widely used in the semiconductor industry for ex-situ (lab) destructive testing of substrates. A typical ex situ SIMS tool has two types of sputtering ion sources: an oxygen gas source that is best for positive ion detection and a cesium (Cs) source (e.g., a liquid Cs ampoule or solid microbeam Cs source) that is best for negative ion detection. Oxygen and cesium are the probing ions for conventional ex-situ SIMS applications. The inventors have observed that oxygen and cesium are universally selected as sputter sources because oxygen and cesium ions are the best and most economical sputter sources for positive and negative detection, respectively.

As inline SIMS tools find their way into the semiconductor fabrication processes, one of the significant challenges is how to improve the negative ion detection sensitivity. A cesium source is used for negative ion detection in ex-situ lab SIMS tools and cannot be used inline with the fabrication processes because of contamination concerns with the cesium metal (metal particles may be formed during metrology tests that will damage or reduce performance of semiconductor structures formed on the substrates, etc.). In other words, in ex-situ testing in a lab environment where the substrate under test will be discarded, the use of cesium metal is acceptable. However, cesium metal cannot be used as an ion source for an inline SIMS process where the substrate continues through fabrication flow and is not discarded. In addition, the inventors have observed that even though oxygen can be used to measure negative ions, oxygen suppresses negative ion production, and the sensitivity for negative ions like oxygen (O), fluorine (F), and chlorine (CI) is very poor.

The inventors sought to overcome the aforementioned significant challenges in order to produce an enhanced inline SIMS process without the above drawbacks. The inventors found that an inert gas (IG) like He, Ne, Ar, Kr, and Xe does not suppress negative ion production unlike oxygen. Thus, using the IG beam would improve the negative ion detection sensitivity over the $O_2$ beam. In addition, IG, such as Ar, is fully compatible with the semiconductor fabrication environment (no formation of metal particles, etc.). The inventors performed experiments with an Ar source, and the results showed that using an Ar source does indeed improve the detection sensitivity for negative ions like O, F, and Cl. However, the inventors also found that switching gases for a SIMS apparatus takes at least three days due to significant mechanical work (e.g., gas line purging, standards requirements, etc.) and source stabilization, and, therefore, cannot be used in high-volume manufacturing.

As a result of the experiments with both mono-elemental gas ($O_2$ or Ar or Kr etc.) and multi-elemental gas mixtures ($O_2$+Ar or $O_2$+Kr, etc.) in the source, the inventors discovered that both $O_2$+ and Ark (or $Kr^+$) ions are present in the source chamber plasma and can be selectively extracted as ion beams. Thus, $O_2$ or IG ion beams can be selected depending on the specific application. By using a gas mixture, ion sources can be switched from one to another automatically by changing the magnetic field in the inline SIMS after the initial setup. Specific gas mixtures can be obtained using either premixed gases or flow controllers and a manifold for the individual gas inlets. The gas mixture details depend on the desired ion beam and source stability. In some embodiments, the initial setup involves the following procedures. The first task is to set up the operation range of gas mixture and pressure, under which the plasma source operates with long-term stability. The second task is to determine the correlation between the selected gas species as sputter ions and the primary beam mass filter, where only the selected ions are allowed into the primary beam-column. Finally, the third task is to adjust the gas mixture to maximize the current for the selected species. Afterward, regular tuning for the selected beam follows, and the conditions are stored for future use.

In some embodiments, all of the measurements start automatically with a call of recipes after a proper wait time for the tool to be stabilized. Since the process can be done automatically, no downtime is needed. A potential drawback of using a mixed gas source might be that the ion beam intensity may be slightly reduced, depending partly on the variability of ionization efficiency with the gas mixture versus the gas mixture ratio. Once the source is stabilized after the initial setup, switching from one species to another is accomplished by choosing an appropriate magnetic field setting in the inline SIMS with some fine adjustment. For example, but not meant to be limiting, heavy oxygen ions ($18O_2^+$), light oxygen ions ($16O_2^+$), and argon ions (Ark) can be obtained using a single source. Various ions generated in the plasma ion source are then extracted and focused, traveling through a primary mass filter (flight tube). Applying an appropriate magnetic field allows the chosen species to go through the flight tube while rejecting all other ions. The ions are then guided through the primary ion column and refocused on the sample surface as a sputter beam. The process is seamless since all the tuning for various species is done at the initial setup. The present principles provide the first use of gas mixing for species selection and tuning as a sputtering ion source for SIMS analysis.

In a view 100 of FIG. 1, an inline SIMS apparatus 102 is depicted. As used herein, an “inline SIMS” refers to a SIMS apparatus or method that can perform metrology sampling from a substrate without interfering with subsequent fabrication of the substrate. In other words, the substrate is not damaged/contaminated or otherwise deemed unusable by the testing performed by the SIMS apparatus or process. Inline SIMS metrology testing is fully compatible with a fabrication flow of a substrate and does not require the substrate to be discarded after testing. As discussed above, the inventors have found that cesium is not compatible with the fabrication flow of a substrate due to metal particle contamination from the use of cesium for SIMS testing. The inline SIMS apparatus 102 of the present principles uses a gas mixture source 104 that excludes cesium and other metallic based gasses from the gas mixture. In some embodiments, compatible gases may include, but are not limited to, oxygen and inert gases such as, but not limited to, argon, helium, krypton, neon, and/or xenon and the like that do not provide a source of metal contamination during use with the inline SIMS apparatus 102.

The gas mixture source 104 provides the gas mixture directly into a plasma chamber 106. Plasma is generated in the plasma chamber 106 to generate distinct ion species based on each of the gases that form the gas mixture. The multiple distinct ion species are then provided to a sputter and detection apparatus 108. A magnetic field is used by the sputter and detection apparatus 108 to select only one of the multiple distinct ion species to use as a sputtering species in a sputtering ion beam 110 directed at particular location on a surface 114 of a substrate 112. In some embodiments, the substrate 112 may be positioned on a substrate support 116 that may be movable to allow appropriate positioning under the sputtering ion beam 110. In a SIMS process, the sputtering ion beam 110 causes sputtering of the surface 114 of the substrate 112 which ejects secondary ions 118 that are then detected by the sputtering and detection apparatus 108.

Figure 2:
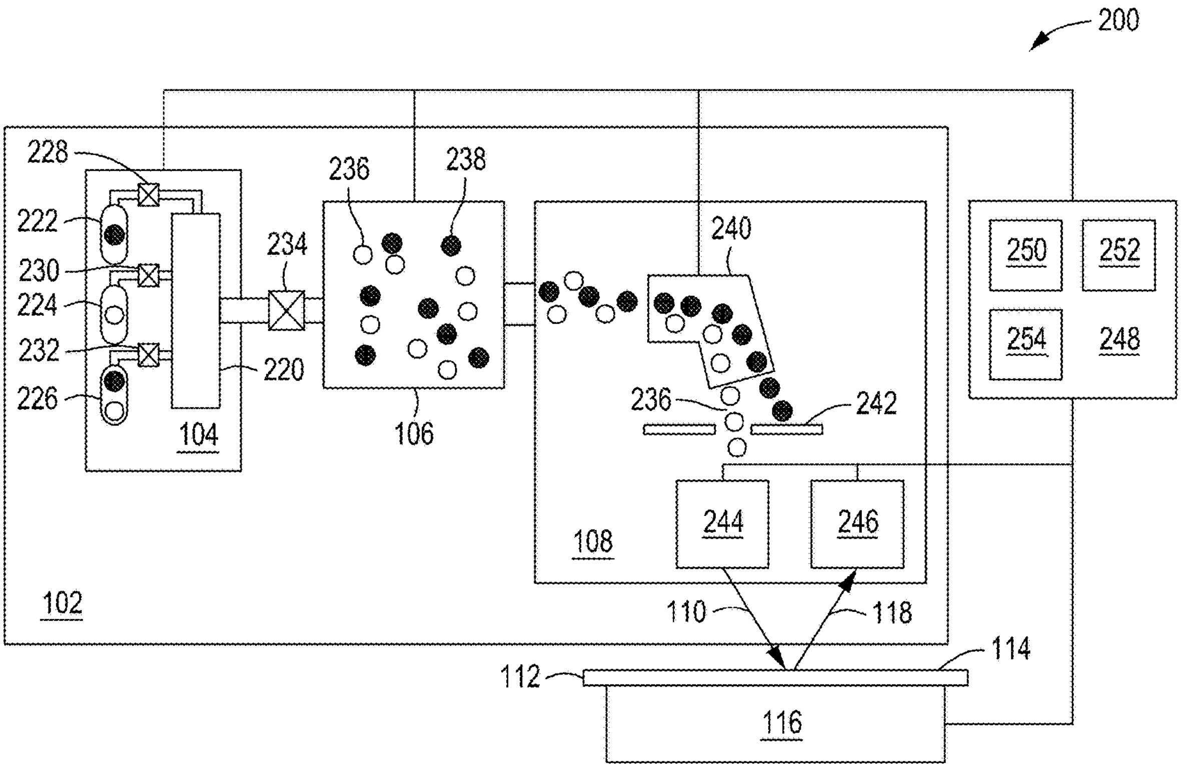
FIG. 2 depicts a cross-sectional view of an inline SMS apparatus with gas and ion selections in accordance with some embodiments of the present principles.

An example of the inline SIMS apparatus 102 that may be used in some embodiments is depicted in a view 200 of FIG. 2. In some embodiments, the gas mixture source 104 may include an optional manifold 220 when one or more of the gases of the gas mixture is to be mixed with one or more other singular gases or with another gas mixture before being introduced into the plasma chamber 106. In the example, which is not meant to be limiting, a first singular gas source 222 is connected to the manifold 220 via a first singular gas flow valve 228. A second singular gas source 224 is connected to the manifold 220 via a second singular gas flow valve 230. In some embodiments, the first singular gas source 222 and the second singular gas source 224 can be flowed into the manifold 220 and mixed according to a desired ratio (e.g., 50:50, 80:20, etc.) before entering the plasma chamber 106. In some embodiments, a third mixed gas source 226 can be flowed directly into the plasma chamber 106 and/or flowed into the manifold 220 via a third mixed gas flow valve 232. As the third mixed gas source 226 already contains two or more gases, in some embodiments, the manifold 220 is not used in conjunction with the third mixed gas source 226.

In some embodiments, the third mixed gas source 226 can be used with the manifold 220 to facilitate in mixing with the first singular gas source 222 and/or the second singular gas source 224 prior to the gas mixture being flowed into the plasma chamber 106. Although depicted in FIG. 2 as containing a mixture of the first singular gas source 222 and the second singular gas source 224, the third mixed gas source 226, in some embodiments, may contain gases other than the gases of the first singular gas source 222 and the second singular gas source 224. In some embodiments, the inline SIMS apparatus 102 may contain a gas mixture source 104 with only singular gas sources or only mixed gas sources and the like. For the sake of brevity, the example is depicted with only two gas types but any number of gas types may be used as singular gas sources and/or mixed gas sources. In some embodiments, a gas mixture source flow valve 234 may be used to regulate the flow of the mixed gases from the gas mixture source 104 into the plasma chamber 106.

The mixed gases enter the plasma chamber 106 and a distinct ion species is formed from each of the gases in the gas mixture from the gas mixture source 104. A first ion species 236 and a second ion species 238 are formed from the gas mixture. In some embodiments, any number of ion species may be formed from each of a multitude of gases forming the gas mixture. The first ion species 236 and the second ion species 238 are ejected from the plasma chamber 106 into a primary mass filter 240 that uses a magnetic field to separate the first ion species 236 from the second ion species 238 based on the mass of each of the ion species. A selected ion species, such as, for example, the first ion species 236 is then directed towards an entrance slit 242 and a focusing apparatus 244. From the focusing apparatus 244, the selected ion species travels, as the sputtering ion beam 110, towards a location on the surface 114 of the substrate 112. The sputtering ion beam 110 sputters secondary ions 118 to a secondary ion detector 246.

Because the inline SIMS apparatus 102 operates within the fabrication flow of the substrate 112, a controller 248 is in communication with various aspects of the inline SIMS apparatus 102 and may also be in communication with other controllers associated with fabricating the substrate 112. As described above, recipes may be used to allow automatic adjustments to the inline SIMS based on local information and/or prior substrate processes and the like. The recipes allow the controller 248 to be programmed for a specific use. In some embodiments, the controller 248 can alter the mixed gas flow rate into the plasma chamber 106 by controlling the gas mixture source flow valve 234; can alter the mixed gas ratios by controlling the first singular gas flow valve 228, the second singular gas flow valve 230, and/or the third mixed gas flow valve 232 and the like; can control the pressure, temperature, and power of the plasma chamber 106; can choose which is the selected ion species by altering the magnetic field intensity of the primary mass filter 240; and/or can determine parameters based on a selected location and/or material of the substrate 112. In some embodiments, the controller 248 can also move the substrate support 116 to facilitate in focusing the sputtering ion beam 110 onto the surface 114 of the substrate 112 at a specific location. Because the plasma in the plasma chamber 106 has multiple ion species to choose from that are already in a stable plasma environment, switching between desired ion species is fast and efficient without requiring equipment downtime, gas evacuations, and stabilization.

The controller 248 controls the operation of the inline SIMS apparatus 102 using a direct control of the inline SIMS apparatus 102 or alternatively, by controlling the computers (or controllers) associated with the inline SIMS apparatus 102. In operation, the controller 248 enables data collection and feedback from the respective systems/apparatus to optimize performance of the inline SIMS apparatus 102 and/or fabrication process of the substrate 112. The controller 248 generally includes a Central Processing Unit (CPU) 250, a memory 252, and a support circuit 254. The CPU 250 may be any form of a general-purpose computer processor that can be used in an industrial setting. The support circuit 254 is conventionally coupled to the CPU 250 and may comprise a cache, clock circuits, input/output subsystems, power supplies, and the like. Software routines, such as a method as described herein may be stored in the memory 252 and, when executed by the CPU 250, transform the CPU 250 into a specific purpose computer (controller 248). The software routines may also be stored and/or executed by a second controller (not shown) that is located remotely from the inline SIMS apparatus 102.

The memory 252 is in the form of computer-readable storage media that contains instructions, when executed by the CPU 250, to facilitate the operation of the semiconductor processes and equipment. The instructions in the memory 252 are in the form of a program product such as a program and/or a recipe that implements the method of the present principles to control inline SIMS apparatus 102. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 3:
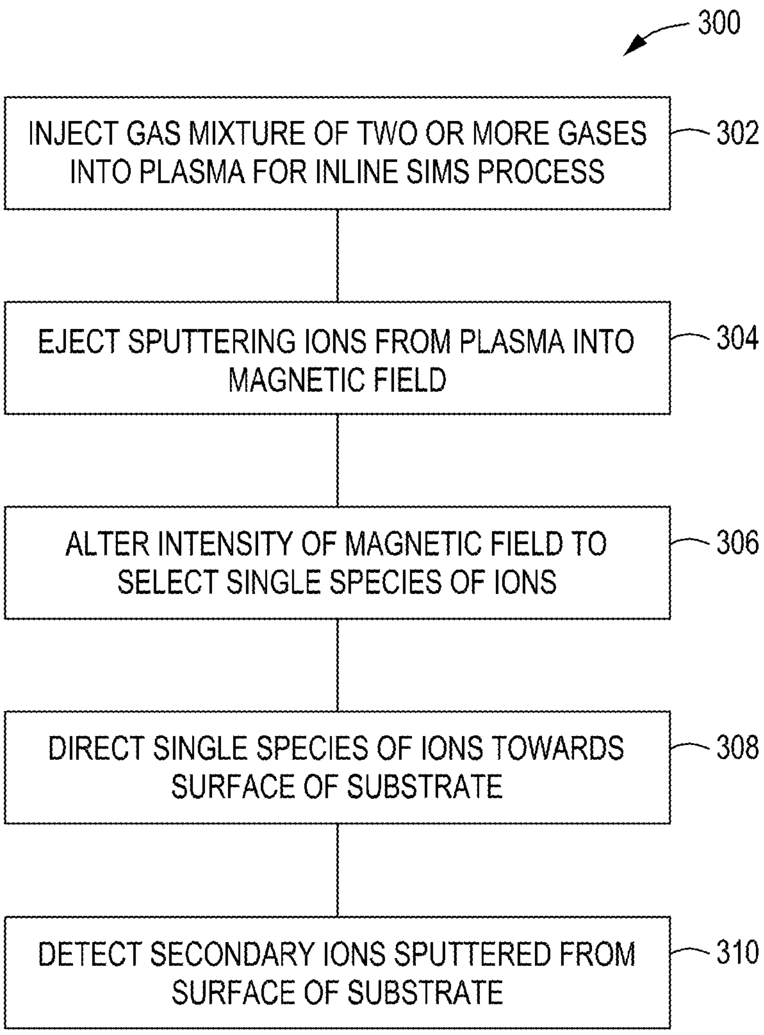
FIG. 3 is a method of performing an inline SIMS process in accordance with some embodiments of the present principles.

A method 300 of performing an inline SIMS process with a mixed gas source is depicted in FIG. 3. In block 302, a premixed gas mixture of two or more gases is injected into a plasma used for an inline SIMS process. The two or more gases produce non-metallic ion species which are compatible with downstream substrate fabrication processes and allow further fabrication to be performed on the substrate after the inline SIMS process is completed. The plasma breaks down the individual gases in the gas mixture into distinct ion species based on each of the individual gases that can be used as primary sputtering ions in the inline SIMS process. In some embodiments, the premixed gas mixture may be an oxygen gas and one or more inert gases such as, but not limited to, argon, helium, neon, krypton, and/or xenon and the like. The ratio or ratios of the gases (e.g., 50:50, 80:20, 70:20:10, etc.) in the premixed gas mixture may be adjusted to obtain a certain beam intensity of primary sputtering ions used to sputter secondary ions from the substrate surface during SIMS processing and/or to increase the sensitivity of the beam to certain materials of the substrate.

In some embodiments, the ratio or ratios of the gases in the premixed gas mixture may be adjusted to increase stability of the plasma in the plasma chamber. Stability of the plasma allows the plasma to continue to produce ions for testing for longer periods of time, increasing substrate yields (decreasing downtime waiting for the plasma to stabilize, etc.). In some embodiments, for example, a controller may be used to automatically select a gas ratio or ratios based on beam intensity, plasma stability, and/or based on sensitivity to certain materials needed for obtaining metrology on substrate materials. In some embodiments, the controller may automatically select the gases in the gas mixture based on a stored recipe. For example, the controller may automatically flow various amounts of each gas into the gas manifold until a desired gas ratio is obtained. The premixed gas mixture is then flowed into the plasma chamber. The plasma in the plasma chamber produces ions specific to each gas type of the premixed gas mixture flowed into the plasma chamber.

In block 304, the multitude of ion species are ejected from the plasma into a magnetic field to select which of the species will be the primary ion sputtering species used to test a surface of a substrate. In block 306, the intensity of the magnetic field is altered to select a single species of ions based on the mass of the ions. In some embodiments the magnetic field can be adjusted to dynamically ("on the fly" without requiring the inline SIMS process to be shut down, etc.) select a desired sputtering species. In block 308, the selected single species is directed towards the surface of the substrate as sputtering ions which cause secondary ions to be sputtered from the surface of the substrate. In block 310, the secondary ions from the surface of the substrate are detected and used to determine various metrology data such as dopant concentration, film material, and the like. By using the premixed gas mixture in the plasma as the ion source for the inline SIMS process, different ion sputtering species can be selected without downtime, gas evacuation, and waiting for plasma stabilization, etc. The method 300 can be performed automatically through recipes and even by other fabrication flow processes and/or by prior substrate processing data via a controller and the like.

In some embodiments of the present principles, the inline SIMS process may be tuned dynamically during the metrology session to alter the sputtering ion beam based on sensitivity to various materials. The ability to tune parameters such as gas ratios, gas selections, ion species filtering, ion intensity selection/control, and/or ion selection based on material sensitivities and the like has not been previously achievable without the discoveries of the inventors as found herein. The ability of an inline SIMS process to be tailorable in real-time without shutting down for reconfiguration will have a substantial impact on increasing the yields of substrates and, at the same, increasing the metrology data through the use of the disclosed methods and apparatus of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for performing a metrology process on a substrate using an inline secondary ion mass spectrometry (SIMS) process, comprising:
injecting a premixed gas mixture of two or more gases into a plasma chamber configured to produce sputtering ions for the inline SIMS process which is compatible with downstream substrate fabrication processes, wherein the two or more gases produce only non-metallic ion species for both positive ion detection and negative ion detection;
ejecting sputtering ions from the plasma chamber into a magnetic field;
altering an intensity of the magnetic field to select a single species of ions formed from only one of the two or more gases of the premixed gas mixture;
directing the single species of ions towards a surface of the substrate; and
detecting secondary ions sputtered from the surface of the substrate by the single species of ions.

2. The method of claim 1, wherein the premixed gas mixture contains, at least, an oxygen gas and at least one inert gas.

3. The method of claim 2, wherein the at least one inert gas is argon gas, helium gas, or xenon gas.

4. The method of claim 1, wherein a selection of the premixed gas mixture or a selection of the single species of ions is accomplished automatically.

5. The method of claim 1, further comprising:
automatically selecting gases or gas ratios for the premixed gas mixture based on a recipe executed by a controller of the inline SIMS process.

6. The method of claim 1, further comprising:
automatically selecting the single species of ions based on a recipe executed by a controller of the inline SIMS process.

7. The method of claim 1, further comprising:
dynamically switching the single species of ions from a first selection of ion species to a second selection of ion species different from the first selection of ion species solely by altering the magnetic field.

8. The method of claim 1, wherein the premixed gas mixture contains two gases with a gas ratio of 50:50 or 80:20.

9. The method of claim 1, wherein the premixed gas mixture is mixed in a gas manifold prior to injecting the premixed gas mixture into the plasma chamber.

10. The method of claim 1, wherein the inline SIMS process is adjusted based on a gas ratio of the premixed gas mixture, mass of ions, or intensity of sputtering ions.

11. The method of claim 1, wherein a gas ratio of the premixed gas mixture is selected based on providing a stabilized plasma in the plasma chamber.

12. A non-transitory, computer readable medium having instructions stored thereon that, when executed, cause a method for performing a metrology process on a substrate using an inline secondary ion mass spectrometry (SIMS) process to be performed, the method comprising:
injecting a premixed gas mixture of two or more gases into a plasma chamber configured to produce sputtering ions for the inline SIMS process which are compatible with downstream substrate fabrication processes, wherein the two or more gases produce only non-metallic ion species for both positive ion detection and negative ion detection;
ejecting sputtering ions from the plasma chamber into a magnetic field;
altering an intensity of the magnetic field to select a single species of ions formed from only one of the two or more gases of the premixed gas mixture;
directing the single species of ions towards a surface of the substrate; and
detecting secondary ions sputtered from the surface of the substrate by the single species of ions.

13. The non-transitory, computer readable medium of claim 12, wherein the premixed gas mixture contains, at least, an oxygen gas and at least one inert gas.

14. The non-transitory, computer readable medium of claim 12, wherein a selection of the premixed gas mixture or a selection of the single species of ions is accomplished automatically.

15. The non-transitory, computer readable medium of claim 12, further comprising:
automatically selecting gases or gas ratios for the premixed gas mixture based on a recipe executed by a controller of the inline SIMS process; or
automatically selecting the single species of ions based on a recipe executed by a controller of the inline SIMS process.

16. The non-transitory, computer readable medium of claim 12, further comprising:
dynamically switching the single species of ions from a first selection of ion species to a second selection of ion species different from the first selection of ion species solely by altering the magnetic field.

17. The non-transitory, computer readable medium of claim 12, wherein the premixed gas mixture is mixed in a gas manifold prior to injecting the premixed gas mixture into the plasma chamber.

18. The non-transitory, computer readable medium of claim 12, wherein the inline SIMS process is adjusted based on a gas ratio of the premixed gas mixture, mass of ions, or intensity of sputtering ions.

19. The non-transitory, computer readable medium of claim 12, wherein a gas ratio of the premixed gas mixture is selected based on providing a stabilized plasma in the plasma chamber.

20. An apparatus for performing an inline secondary ion mass spectrometry (SIMS) process, comprising:
a premixed gas mixture source that contains a premixed gas mixture of two or more gases, wherein the two or more gases contain only non-metallic ion species which are compatible with downstream substrate fabrication processes;
a plasma chamber fluidly connected to the premixed gas mixture source and configured to produce two or more ion species from the two or more gases from the premixed gas mixture source;
a primary mass filter that is fluidly connected to the plasma chamber and configured to select a sputtering ion species from the two or more ion species by adjusting a magnetic field; and
a controller configured to automatically:
inject the premixed gas mixture from the premixed gas mixture source into the plasma chamber;
eject ions formed from the two or more gases from the plasma chamber into the magnetic field of the primary mass filter; and alter an intensity of the magnetic field to select a single species of ions formed from only one of the two or more gases of the premixed gas mixture, wherein the single species of ions is non-metallic for both positive ion detection and negative ion detection.

* * * * *